United States Patent [19]

Levinson

[11] Patent Number: 5,019,769

[45] Date of Patent: May 28, 1991

[54] SEMICONDUCTOR LASER DIODE CONTROLLER AND LASER DIODE BIASING CONTROL METHOD

[75] Inventor: Frank H. Levinson, Redwood City, Calif.

[73] Assignee: Finisar Corporation, Menlo Park, Calif.

[21] Appl. No.: 583,178

[22] Filed: Sep. 14, 1990

[51] Int. Cl.$^5$ .............................................. H01S 3/10
[52] U.S. Cl. ........................................ 372/31; 372/29
[58] Field of Search ....................... 372/29, 31, 38, 32

[56] References Cited

U.S. PATENT DOCUMENTS

| 4,878,225 | 10/1989 | Aiba et al. | 372/38 |
| 4,890,288 | 12/1989 | Inayama et al. | 372/31 |
| 4,903,273 | 2/1990 | Bathe | 372/38 |
| 4,918,681 | 4/1990 | Ikeda | 372/29 |

*Primary Examiner*—James W. Davie
*Attorney, Agent, or Firm*—Flehr, Hohbach, Test, Albritton & Herbert

[57] ABSTRACT

A laser diode controller uses a programmed microcontroller to accurately control the process of turning on and selecting the operating point of the laser diode. The laser diode has a front facet for transmitting light, and a back facet for monitoring the laser diode's optical output power. Once the back facet of the laser diode is calibrated, the controller can accurately monitor the laser diode's operating characteristics, and can select the best operating point current based on the current operating characteristics of the laser diode. During calibration of the laser diode, the controller can check the linearity of the laser diode's optical output power as a function of drive current, and can thereby detect defects in the laser diode. In a full duplex optical link, the controller of the present invention prevents the laser diodes from generating light at their full normal intensity until the integrity of the link has been established, thereby preventing light from the laser diode's from accidentally damaging user's eyes. Furthermore, the controllers can use the full duplex link to establish lower operating point drive currents that would otherwise be used, thereby significantly lengthening the lifetime of the laser diodes. A laser diode's operating characteristics change over time in such a way as to enable the controller to predict when the laser will fail. The controller records the operating characteristics of the laser diode in a nonvolatile memory, analyzes changes in those characteristics, and generates a failure warning message when those changes match predefined failure prediction criteria.

25 Claims, 7 Drawing Sheets

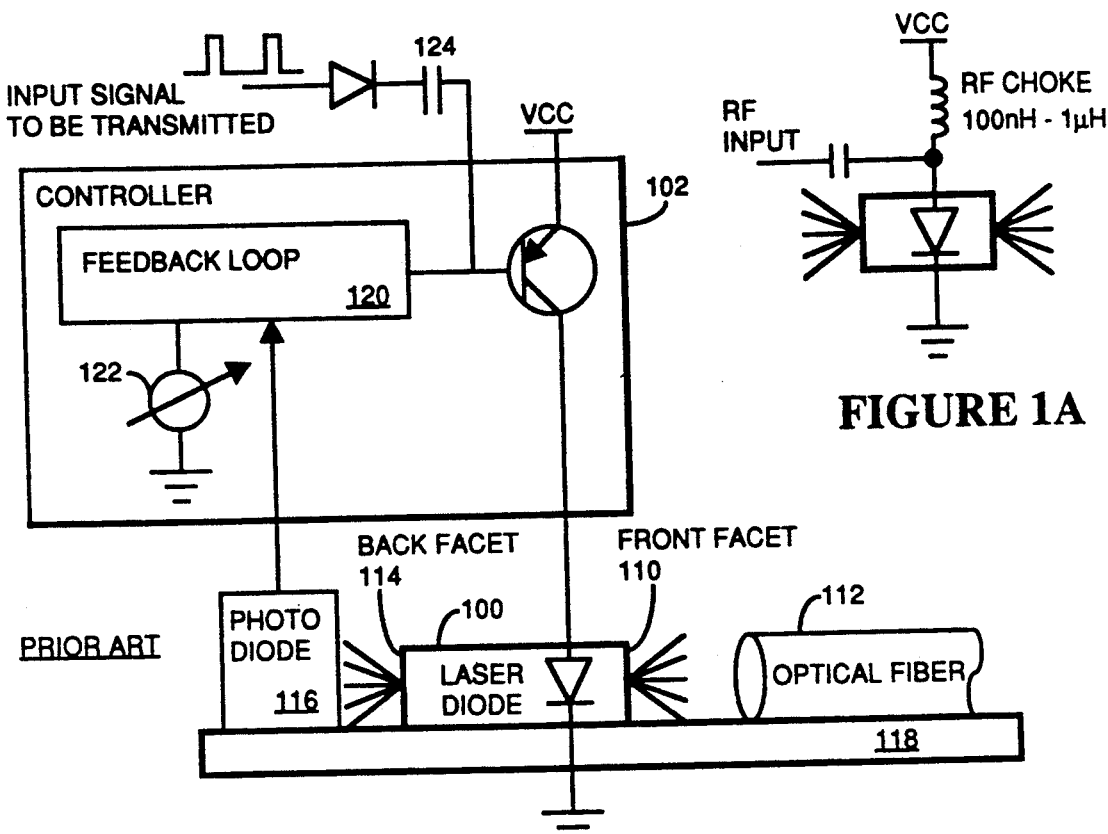
FIGURE 1
FIGURE 1A
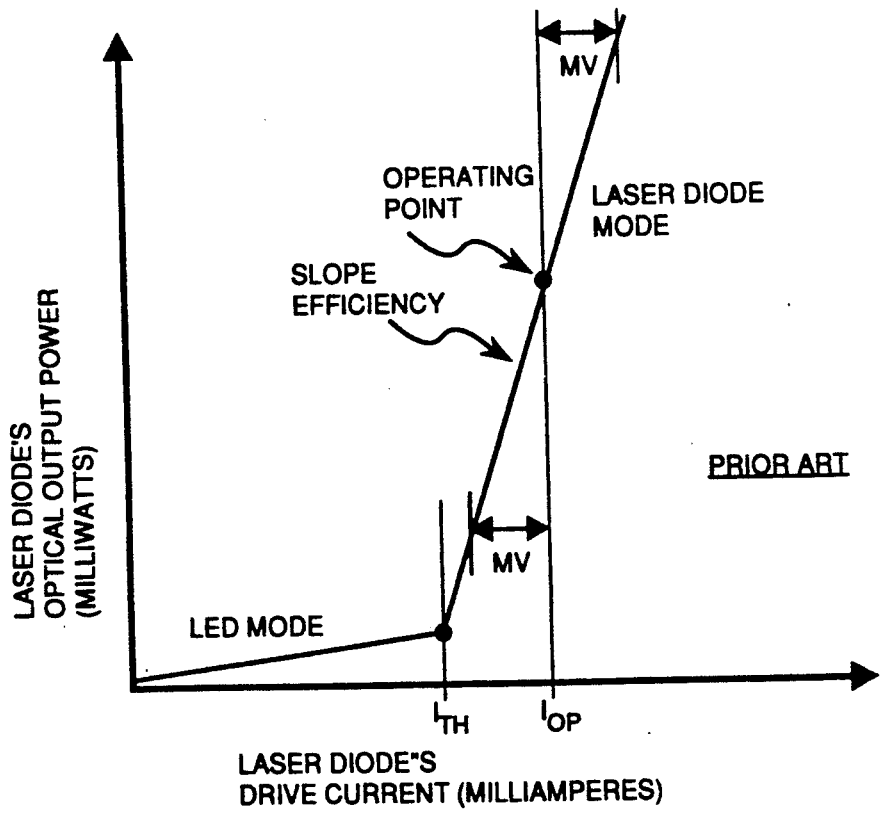
FIGURE 2

|  | VALUE | A/D & D/A COUNTS | SET POINT | LASER CONTROL COMMANDS | |
|---|---|---|---|---|---|
| OPTICAL POWER(mW) | XX.XX | ZZZZ | SS.SS | < > | SELECT ITEM |
| DRIVE CURRENT(mA) | XX.X | ZZZZ |  | <CR> | EXECUTE/MAIN MENU |
| RF POWER | XX.X | ZZZZ | SS.S | U,L | UP OR DOWN - FINE ADJ |
| LD TEMPERATURE(C) | XX.X | ZZZZ | SS.S | SHFT U,L | UP OR DOWN - MED ADJ |
| DC BIAS |  | YYYY |  | CNTL U,L | UP OR DOWN - LRG ADJ |
| TEC | XX.X | YYYY |  | ESC | RESET TO INITIAL STATE |
| RF ATTENUATOR |  | YYYY |  | ^R | REDRAW SCREEN |
| AMBIENT TEMP(C) | XX.X | ZZZZ |  | ^D | TOGGLE OPT DISPLAY |

MAIN MENU

SET POINT CONTROL
MANUAL CONTROL
DEBUG

FIGURE 11

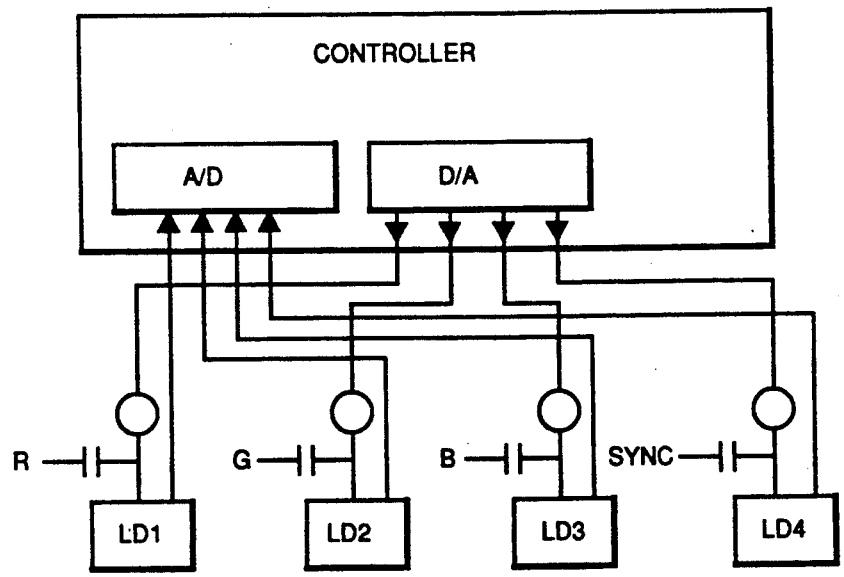

FIGURE 12

SEMICONDUCTOR LASER DIODE CONTROLLER AND LASER DIODE BIASING CONTROL METHOD

The present invention relates generally to semiconductor laser diodes and particularly to the controllers and control methods used to bias and drive laser diodes.

BACKGROUND OF THE INVENTION

Referring to FIG. 1, there is shown a laser diode 100 and a prior art analog laser diode controller 102. The laser diode 100 has a front facet 110 which emits coherent light that is to be transmitted, usually into some optical component such as an optical fiber 112, and a back facet 114. Light emitted by the back facet 114 is received by a photodiode 116 which is used to continuously monitor the optical power being output by the laser diode 110. In general, the amount of optical power output by the front facet 110 is directly proportional to the optical power output by the back facet 114:

Power(front facet) = Power(back facet) / K

While K is often equal to 1, the amount of back facet power received by the photodiode 116 varies considerably from package to package, and therefore must be separately calibrated for each laser diode.

Typically, the laser diode 100, the back facet photodiode 116, and the outgoing optical fiber 112 (or a mechanism for holding the outgoing optical fiber) are all mounted on a common platform or housing 118. In some cases, the housing 118 includes a solid state thermoelectric cooler for maintaining the laser diode 100 at a specified temperature.

Referring to FIG. 2, the optical output power of the laser diode is a non-linear function of the laser diode's drive current. In particular, when forward bias current is applied to a semiconductor laser it begins to emit light in a manner similar to light emitting diodes (LEDs). This type of emission is known as spontaneous emission because it happens randomly from excited atoms in the laser diode's cavity, and is commonly called LED mode.

At a certain drive current, herein called the threshold current, $I_{TH}$, the laser diode's efficiency in converting current into light increases dramatically. This is the point where the laser diode changes from the LED mode of operation to the lasing mode of operation.

While various classes of laser diodes will have thresholds in the same general range of currents, the threshold current $I_{TH}$ varies considerably among laser diodes of the same type and also varies with the temperature and age of the laser diode. For example, the threshold current of some laser diodes can vary by as much as fifty percent or more with changes in temperature. The effect of this temperature sensitivity is that at a given drive current the laser diode could be operating above its recommended levels at one temperature while not even lasing at another temperature.

When the laser diode is operating in the lasing mode, that is at a drive current in excess of the threshold current, there is a characteristic slope that determines the laser diode's efficiency. More specifically, each laser diode's "slope efficiency" is equal to the ratio of changes in the laser's optical output power to changes in the drive current while operating in the lasing mode. Slope efficiency varies from laser diode to laser diode, and also varies with temperature and with the age of the diode.

The "operating point" or bias current, $I_{OP}$, for a diode laser is a generally set by the user of the laser diode so that it is within the current range for lasing mode of operation, and so that the laser diode remains in lasing mode when the current is modulated by an input signal. Thus, if the maximum variation of the input signal below the operation point is MV, the operation point must be greater than $I_{TH}+MV$. In addition, the operation point must be set sufficiently high that a receiving photodiode will be able to receive the transmitted light, and yet the operation point must not be set so high as to burn out the laser diode.

Referring back to FIG. 1, prior art diode controllers 102 typically contain an analog feedback loop 120 coupled to a potentiometer 122, or some other similar mechanism, for manually adjusting the laser's operating point. The user typically turns the gain of the feedback loop 120 down before powering on the laser diode's controller, and then manually adjusts the gain upwards until the desired amount of optical output power is achieved. Optical output power is typically measured using another photodiode coupled to the front facet by an optical fiber 112, or by some similar set up (not shown in FIG. 1). After the laser diode's controller 102 is calibrated using potentiometer 112, signals to be transmitted are superimposed on the laser diode's operating point current $I_{OP}$ by a capacitor 124, thereby modulating the output power of the laser diode 110. Some analog controllers employ multiple potentiometers to separately set threshold current, operating bias current and back facet photodiode feedback control, which components make such analog controllers both difficult to tune and expensive to manufacture.

In general, any laser diode will be destroyed if its optical output power exceeds a certain limit. Given the very sharp slope of the optical output when operation in lasing mode, it is generally quite easy to destroy a laser diode while trying to select its operating point. In fact, many very expensive lasers, such as those used by telephone companies for transmitting telephone signals over optical fibers and those used in the cable television industry, have been destroyed during calibration. Such losses may be caused by adjusting the calibration potentiometer too quickly, by problems in the equipment monitoring the output of the front facet during calibration, causing the laser diode to be turned on too hard, and by many other hazards.

In general, the setup procedure for calibrating laser diodes is time consuming and expensive, and subject to various forms of operator error.

Another important limitation in prior art laser diode controllers is that they cannot be used to predict device failures in advance of when it occurs. Many semiconductor laser diodes are used in vital communications systems, and when such lasers fail, they can cause entire communications systems to fail. If the failure of laser diodes could be accurately predicted, a preventative maintenance program could be implemented to prevent system failures by replacing such laser diodes prior to the time that failure is predicted. Currently, such laser diodes are replaced solely based on their time in service without regard to their actual operability.

SUMMARY OF THE INVENTION

In summary, the present invention is a laser diode controller which uses a programmed digital controller to accurately measure a laser diode's operating characteristics and to control the process of turning on and selecting the operating parameters of the laser diode. Light from the laser diode's front facet is used for transmitting light and light from the laser diode's back facet is used for monitoring the optical output power generated by the laser diode. Once the back facet photodiode of the laser diode is calibrated, the controller can accurately monitor the laser diode's operating characteristics, and can select the best operating point current based on the current operating characteristics of the laser diode.

During calibration of the laser diode, the controller can check the linearity of the laser diode's optical output power as a function of drive current, and can thereby detect defects in the laser diode. A unique transistor d.c. power and a.c. signal connection arrangement is used to reduce RF noise.

In a full duplex optical link, with digital controllers used at both ends of the optical link, the controller of the present invention prevents the laser diodes from generating light at their full normal intensity until the integrity of the link has been established. Once the link is established, the controller continues to monitor the integrity of the link and reduces the laser diode's output power if the link is interrupted. In this way the controller can prevent light from the laser diode's from accidentally damaging user's eyes. Furthermore, the controllers can use the full duplex link to establish lower operating point drive currents that would otherwise be used, thereby significantly lengthening the lifetime of the laser diodes.

The operating characteristics of a laser diode change over the device's lifetime in such a way as to enable the controller to predict when the laser diode will fail. The controller of the present invention records the operating characteristics of the laser diode in a nonvolatile memory, analyzes changes in those characteristics, and generates a failure warning message when those changes match predefined failure prediction criteria.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of a prior art laser diode and controller. FIG. 1A shows a prior art RF choke arrangement used with some prior art laser diodes.

FIG. 2 depicts a graph of the relationship between drive current and optical output power for a laser diode.

FIG. 11 depicts the display generated by the user interface of the preferred embodiment of a laser diode controller.

FIG. 12 is a block diagram of a multichannel laser diode controller in accordance with the present invention.

DESCRIPTION OF THE PREFERRED EMBODIMENT

Figure 3:
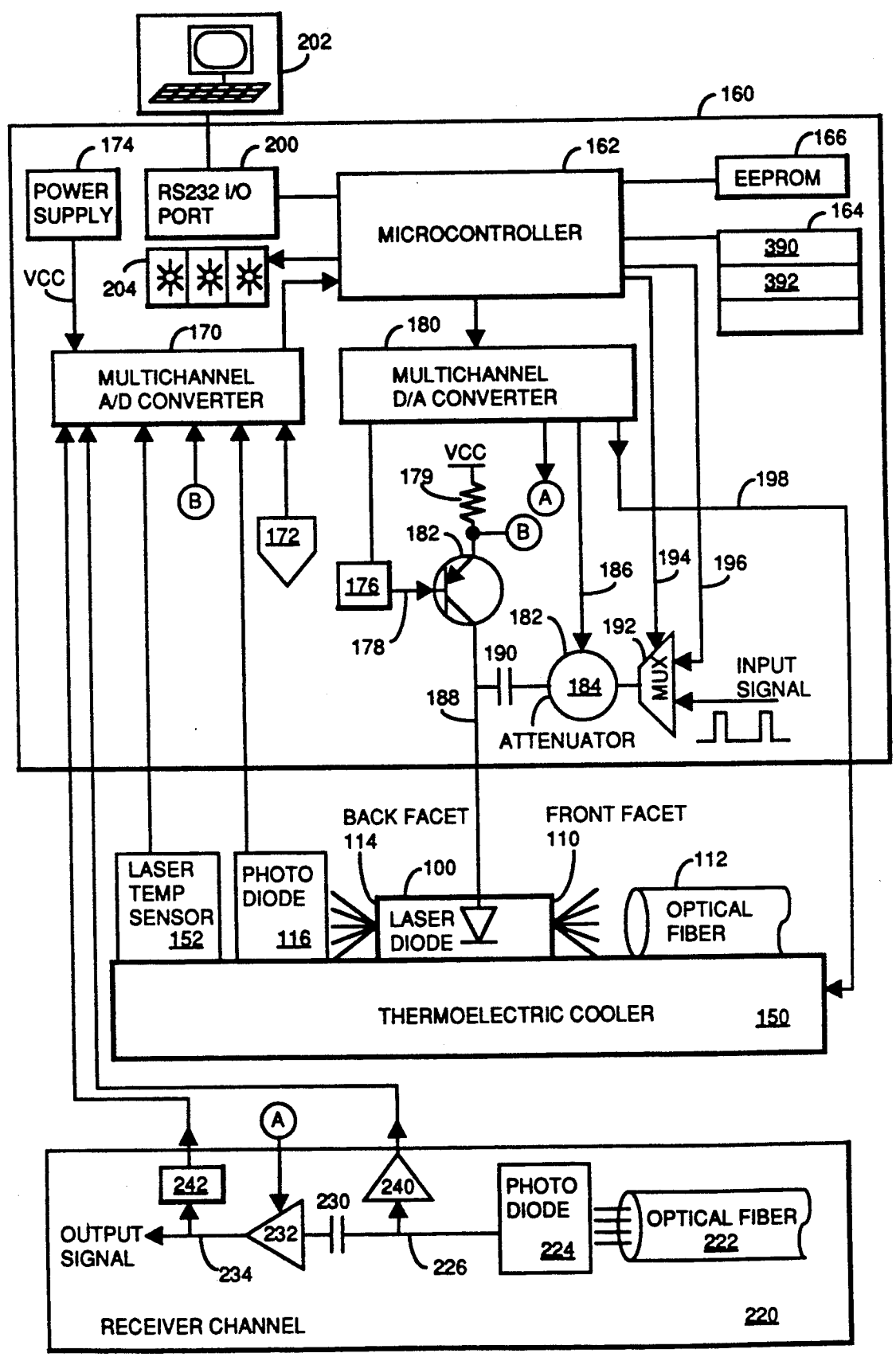
FIG. 3 is a block diagram of a laser diode controller in accordance with the present invention.

Referring to FIG. 3, there is shown a laser diode 100 and back facet photodiode 116 which are mounted onto a thermoelectric cooler 150. The purpose of the thermoelectric cooler 150 is to permit the laser diode 100 to operate in a constant temperature or temperature controlled environment. In addition, there is a temperature sensor 152 (e.g., a thermocouple) mounted near or adjacent the laser diode 100 for measuring the temperature of the laser diode.

The operation of the laser diode 100 is controlled by a digital controller 160. The central component of the digital controller 160 is a microcontroller 162, such as a 68HC11 or 68HC05 (both of which are manufactured by Motorola). Software for the microcontroller 162 is stored in a read only memory (ROM) or in an (erasable) electrically programmable read only memory (EPROM) 164, including a power on sequence control program 390, and a continuously running device monitoring and control program 392. Device characteristics of the laser diode 100, as measured by the controller 160, are stored in an nonvolatile memory 166 such as an EEPROM, as will be described in more detail below.

A multichannel analog to digital (A/D) converter 170 is used by the microcontroller to monitor the output signals generated by the laser's temperature sensor 162, the back facet photodiode 116, and an ambient temperature sensor 172. The ambient temperature sensor 172 is monitored by the microcontroller 160 so that the laser diode 100 can be shut down when excessive ambient temperatures are experienced. Typically, the thermoelectric cooler 150 will not be able to keep the laser diode 100 at a satisfactory temperature when the ambient temperature rises above a specified level. By automatically shutting the laser diode down when an over-temperature condition is detected, valuable laser diodes can be protected from burning out.

The multichannel A/D converter 170 can also be used to monitor the stability of the controller's power supply 174. Laser diodes are particularly susceptible to electronic damage from surge currents or other power supply variations. Therefore, in one preferred embodiment the digital controller 160 is programmed to measure the power supply 174 for stability before initializing the laser diode 100 and to continue to monitor it after start up as well.

A multichannel digital to analog (D/A) converter 180 is used (1) to set the bias current of the laser diode 100, (2) to control the gain of an input signal attenuator 184, and (3) to control the thermoelectric cooler 150. In particular, the microcontroller 162 generates a digital value for the laser diode's bias current, and the D/A converter 180 converts that into an analog voltage signal. The resulting signal is then low passed filtered by an RC filter 176 with a long time constant (on the order of 0.1 to 0.5 seconds, depending on the embodiment of the invention being used), and the filtered control signal on line 178 drives the bases of a PNP transistor 182, which in turn drives the laser diode 100.

The controller 160 measures the current flowing through the laser diode by monitoring the voltage drop across a high precision resistor 179, in particular by monitoring the Vcc voltage from the power supply 174 and the voltage at node B on the emitter of transistor 182. As shown in FIG. 3, both of these voltages are read by the microcontroller 162 via the A/D converter 170. The laser diode current is then computed by using Ohm's law: current equals the voltage drop across the resistor divided by the resistance of the resistor. That computed value could then be reduced by the base current, which is a known fraction (1/Beta) of the emitter current, but this correction is usually so small that it is not necessary. The microcontroller 162 computes a running average of the laser diode current so as to filter out the effects of any current fluctuations caused by input signals being transmitted, which modulate the laser diode's drive current.

Many laser diode manufacturers and optical link builders have found it advantageous to either feed a.c. signals to the laser diode through the base of a drive transistor 102, as shown in FIG. 1, or to use the RF choke arrangement shown in FIG. 1A. One supplier has actually placed the RF choke shown in FIG. 1A inside the hermetic laser diode's package so as to minimize the capacitance of the a.c. signal feed line and to thereby reduce RF coupling problems (e.g., signal distortion).

It is unexpectedly advantageous to use the collector of transistor 182 as a high impedance d.c. source for the laser diode 100. No RF choke is used. The bipolar transistor 182 is preferably a transistor with very low collector capacitance, typically an "RF" transistor, which will create minimal RF bandwidth attenuation of the a.c. input signal being transmitted. This d.c. power sourcing arrangement is believed to generate significantly less noise than the best commercially available link using the RF choke arrangement.

Because the "RF" transistor 182 has very fast response as well as low capacitance, it is important to have a RC filter 176 which protects the laser diode 100 from current spikes. In general, it has been found that the lifetime of laser diodes is significantly degraded by current spikes. As will be described in more detail below, the RC filter 176 is modified so as to change its RC time constant to a value of about 0.01 seconds in full duplex link applications so that the d.c. signal level of the link can be used to transmit information between a pair of laser diode controllers.

An optical, electronically tunable (i.e., variable) attenuator 184 controls the amplification or attenuation of input signals that are to be optically transmitted by the laser diode 100. Thus the control signal from the D/A converter 180 on line 186 is essentially an automatic gain control signal. The attenuated input signals are a.c. coupled to the laser diode's drive line 188 by a capacitor 190. Input signals are typically high frequency digital or analog signals that are generated externally to the laser diode controller 160.

However, in one embodiment of the present invention a multiplexer 192 is provided on the input signal path so that the microcontroller 162 can transmit data over the optical link. For this purpose the microcontroller 162 generates an input selection signal on line 194 for controlling the multiplexer 192, and sends data to be transmitted on line 196 to one of the multiplexer's input ports. This capability is used in certain embodiments of the invention in which a pair of full duplex link controllers minimizes the optical power used for transmitting information over the optical link, as will be described in more detail below.

The amount of cooling by the thermoelectric cooler 150 depends on the amount of current running through the cooler 150, which is in turn controlled by the microcontroller 162 by sending a digital control signal to the D/A converter 180, which converts the control signal into analog form and then transmits the resulting signal on line 198 to the cooler 150.

If a solid state thermoelectric cooler (TEC) 150 is present, the controller unit must use a feedback signal from a thermistor 152 or other temperature sensing device inside the laser diode's housing (not shown). The controller is set up to hold the laser diode at a particular temperature over the life of the laser diode.

In general it is difficult to specify an operating temperature to an analog controller. Moreover, analog controllers have been known to overdrive and burn out the TEC 150 by trying to maintain a set point temperature even during conditions in which it is impossible for the TEC to maintain that temperature. In fact, it has been found that TEC failure is a significant failure mechanism for packaged laser diodes.

The digital controller of the present invention overcomes the prior art problems with TEC burnout (1) by specifying the laser diode operating temperature such that TEC operation is minimal and only for stabilization rather than for gross continual cooling, and/or (2) by specifying, in software, temperature boundaries for "normal operation", and curtailing full power operation of the laser diode (i.e., forcing the laser diode to operate at lower output power) when the operating conditions fall outside the normal operation specifications so as to avoid damaging or excessively aging the laser diode. Furthermore, the drive current for the TEC is limited to a predefined maximum value at which it is known that the TEC can operate indefinitely, thereby preventing TEC burnout.

An RS232 input/output port 200 couples the microcontroller 162 to external devices, such an ASCII terminal or desktop computer 202. The computer 202 can read data stored in the EEPROM 166, and can set parameters for the controller 160, such as the target temperature for the laser diode, a target optical output power setting, and so on. The RS232 port 200 is also used during initial calibration of the back facet photodiode 116, as will be described in more detail below.

The digital controller often runs a fiber optic data link for some type of computer host, and thus the link can be considered to be a subsystem of a host computer. The RS232 port can also be used by the host computer system to communicate with the data link subsystem. Information such as link status, laser diode aging, are passed up to a monitoring software routine running in the host computer system. The host computer can also command the link to preform various functions such as self test, automatic gain control, and so on.

Finally, a set of front panel LEDs 204 are coupled to the microcontroller 162. The LEDs 204 communicate the status of the laser diode 100 without having to plug a computer 202 into the microcontroller's communication port 200. In particular, there is a green LED denoting normal operation, a yellow LED denoting that the controller 162 is in the process of initializing the laser diode, and a red LED denoting that the laser diode has either failed or is in need of replacement.

RECEIVER CHANNEL.

One preferred embodiment of the present invention is a controller for a full duplex optical channel, and therefore the controller 160 is also coupled to a receiver channel 220 that will be described next. However, it should be understood that many features of the present invention apply to unidirectional laser channels.

The receiving channel 220 has an incoming optical link 222, which is typically an optical fiber of standard construction. The light transmitted by the optical link 222 is converted into an electric signal by a photodiode 224. The resulting signal, which has both d.c. and a.c. components is asserted on line 226. The a.c. component of the received signal is separated from the d.c. component by a capacitor 230, and the resulting a.c. signal is amplified by a variable gain amplifier 232 before being transmitted on line 234 to devices external to the controller 160 for whatever type of signal processing is required.

The gain of the a.c. signal amplifier 232 is controlled by the microprocessor 162 via the D/A converter 180. In particular, the gain of the a.c. signal amplifier 232 has a nominal standard setting, corresponding to a predefined digital value set in the microprocessor 162. The gain of the amplifier can then be increased if a.c. component of the received signal is observed (using peak detector 242, discussed below) to be weaker than normal, or decreased if the received signal is stronger than normal.

The d.c. component of the received optical signal is monitored by using an operational amplifier 240 to measure the d.c. signal level on line 226, and transmitting the resulting value to the microcontroller 226 via the A/D converter 170. The magnitude of the output a.c. signal on line 232 is monitored by using a peak detector 242 to measure the magnitude of the a.c. signal.

AUTOMATIC SELF INITIALIZATION OF LASER DIODE, AND INITIAL CALIBRATION OF BACK FACET PHOTODIODE.

Figure 4:
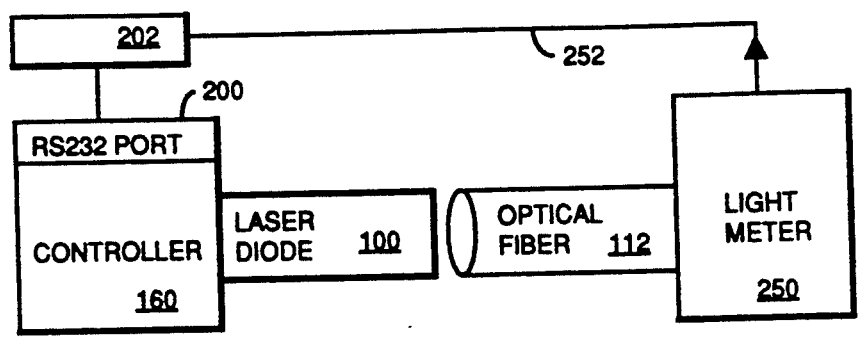
FIG. 4 depicts the connection of a laser diode and its controller to a light meter for calibration of the laser's back facet photodiode.
Figure 5:
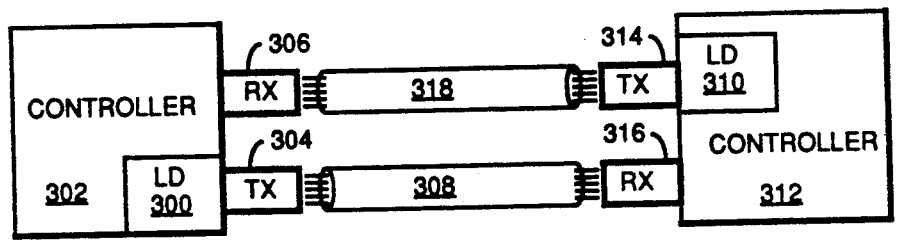
FIG. 5 is a block diagram of a full duplex optical link.

Referring to FIGS. 3, 4 and 5, there are three primary physical situations to be considered when initializing the laser diode upon powering on the laser diode controller.

The first situation is the one shown in FIG. 3, in which it is not known where the output of the laser diode 100 is being sent. Thus, there is no feedback, other than that provided by the back facet photodiode 116 as to the operation of the laser diode 100. This situation requires that the controller's control software be provided some a priori knowledge of the back facet photodiode's characteristics and its coupling to the laser diode.

The second situation, shown in FIG. 4, is used when the controller 160 and its laser diode 100 are being turned on for the first time. In this situation, a light meter 250 is coupled to the output of the front facet of the laser diode 100, typically via an optical fiber 112. The light meter is coupled both to the output of the laser diode 100 and to a computer or work station 202 that is used during the laser calibration process. The computer 202, in turn, is coupled to the communications port 200 of the controller.

In the preferred embodiment, the light meter 250 monitors the optical output of the laser diode 100 until the optical output power reaches a specified level, which is 1 milliwatt in the preferred embodiment. When the measured optical output power reaches that level, the light meter sends a signal to the computer 202, and the computer sends a corresponding message to the controller's microcontroller via the communications port 200. In this way, the controller 160 can determine what reading from the laser's back facet photodiode corresponds to a predefined level of optical output power from the front facet.

The ratio of back facet to front facet optical output power can vary considerably among laser diodes. However, this ratio is constant for any single laser diode, and therefore only this one measurement is required for calibrating the back facet photodiode of the laser diode, providing the photodiode responds linearly to the laser diode. The measured calibration value, which is the back facet photodiode measurement value for 1 milliwatt of optical output power on the front facet, is stored in the controller's nonvolatile memory 166. From this point on, the controller can determine the amount of optical output power being generated by the front facet of the photodiode as being:

Power(front facet) = Power(back facet) / K where "Power(front facet)" is measured in units of milliwatts, "Power(back facet)" is measured in terms of the current flowing through photodiode 116, digitized by the A/D converter 170, and K is the calibration value for the back facet of the laser diode which is stored in the nonvolatile memory 166.

Some laser diode packages have back facet photodiodes which do not respond linearly to the laser diode's optical output. In this case the controller is programmed to use a more complex mathematical equation to specify the relationship between photodiode measurements and the laser diode's output power, such as a second or third order polynomial. To determine the coefficients of such an equation the relationship between back facet photodiode measurement and front facet optical output power must be calibrated at several points (typically at eight to twelve points) distributed over the expected operating range.

The third situation, shown in FIG. 5 depicts a full duplex optical link, including two interconnected laser diodes 300 and 310. Each laser diode has its own digital controller 302, 312, and the optical transmitting port 304, 314 of each laser diode is coupled to a receiving port 306, 316 of the other laser diode by an optical fiber 308, 318.

Control functions for each of these three situations will be discussed below with reference to the flow charts shown in FIGS. 8, 9 and 10.

Figure 6:
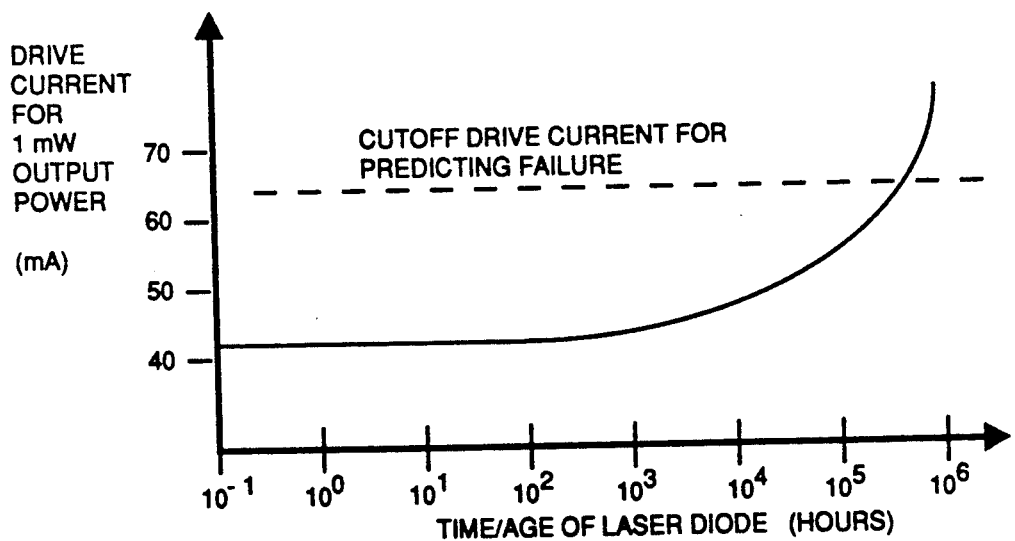
FIG. 6 depicts a graph of the aging characteristics of a typical laser diode.

An important characteristic of laser diodes is that these devices age with use, even when the devices are not exposed to excessive currents and temperatures, and eventually fail. FIG. 6 depicts a logarithmically scaled graph of the aging characteristics of a typical laser diode, using drive current measurements taken over a period of time at constant operating temperature. As shown, the drive current required for generating a constant level (e.g., one milliwatt) of optical output power increases with the age of the laser diode. Typically, there will be very little increase in the required drive current during the first thousand hours of operation of the laser diode, an acceptable level of increase through a few tens of thousands of hours of operation, with a large increase in the required drive current shortly before device failure.

Figure 7:
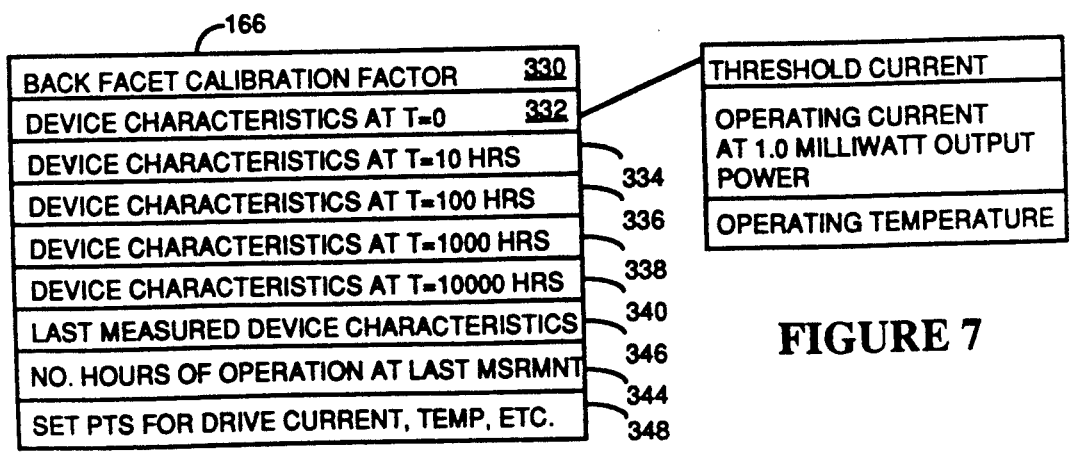
FIG. 7 depicts data stored in nonvolatile memory in the preferred embodiment of a laser diode controller.

Storing measurement data in the nonvolatile memory 166 of the controller 160, as shown in FIG. 7, enables the preferred embodiment of a laser diode controller to predict failure of the laser diode and to send a warning to a host computer, prior to failure of the device, that the laser diode needs to be replaced. In particular, when the controller finds that drive current required for generating a predefined level of optical output power exceeds the original level of drive current needed when the device was new by a predefined percentage (e.g., ten percent), after compensating for any temperature differences between the measurements being compared, failure of the device is imminent and the controller 162 will generate a warning message.

As shown in FIG. 7, the memory locations in the nonvolatile memory 166 are structured and used by the microcontroller 162 to store the back facet calibration factor for the laser diode 3 (slot 330), device measurements for the laser diode taken when the laser diode is turned on for the first time (slot 332), device measurements after 10, 100, 1000, and 10,000 hours of operation (slots 334, 336, 338, 340), the number of hours of operation of the laser diode (slot 344). Furthermore, device measurements are taken by the controller periodically during operation of the laser diode (e.g., once every ten hours of operation) and the last of those device measurements is stored in slot 346 of the nonvolatile memory 166. Each set of device measurements comprises the measured threshold current for the laser diode, the drive current required for one milliwatt of optical output power, and the operating temperature of the laser diode at the time that the measurements were made. Also stored in slot 348 of the nonvolatile memory are set point values for the laser diode's drive current, operating temperature and RF power.

When the laser diode 100 and its controller are initially manufactured, the EEPROM 166 contains no data.

Figure 8:
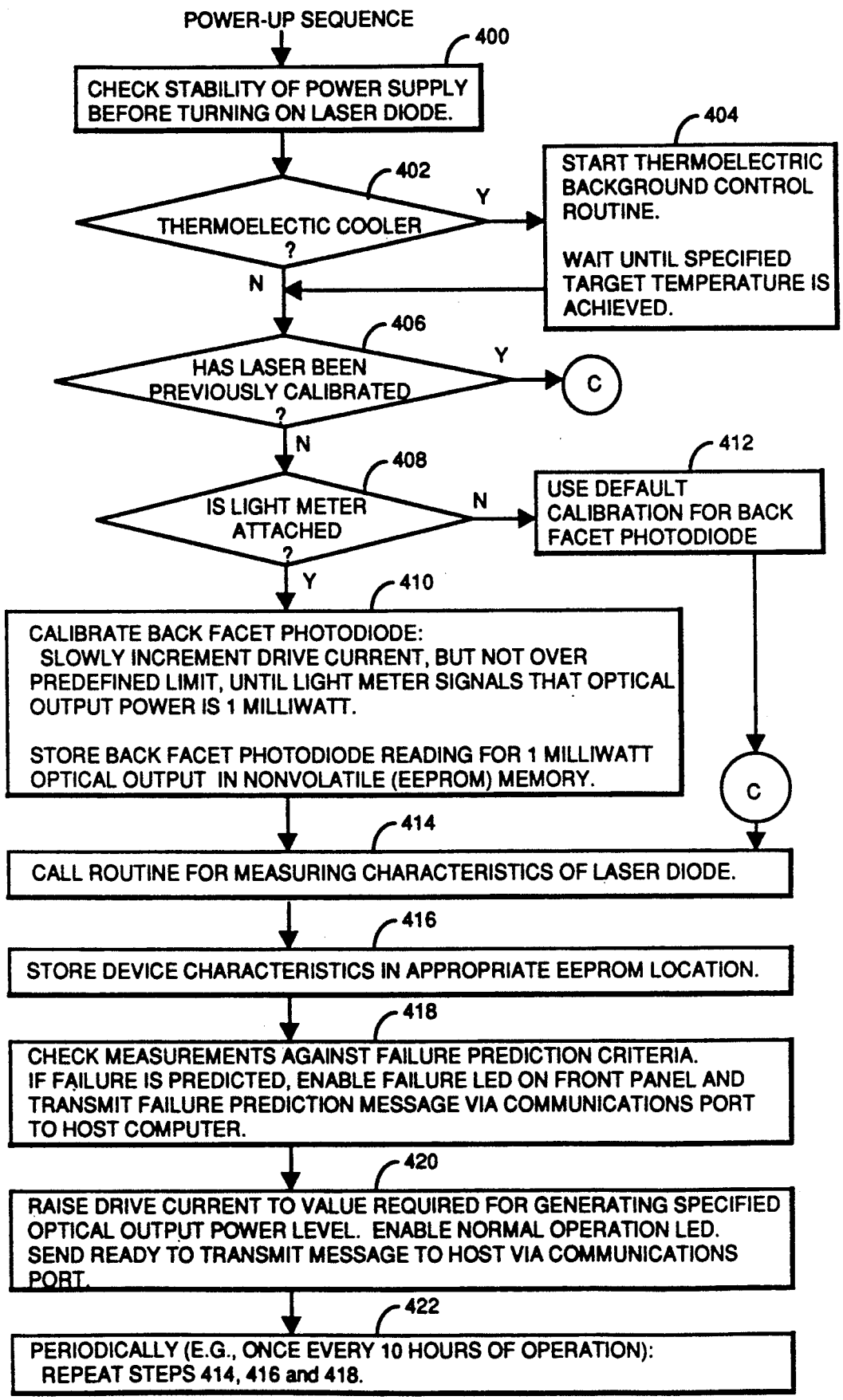
FIGS. 8 and 9 are flow charts of the laser diode calibration and initialization method of the present invention.
Figure 9:
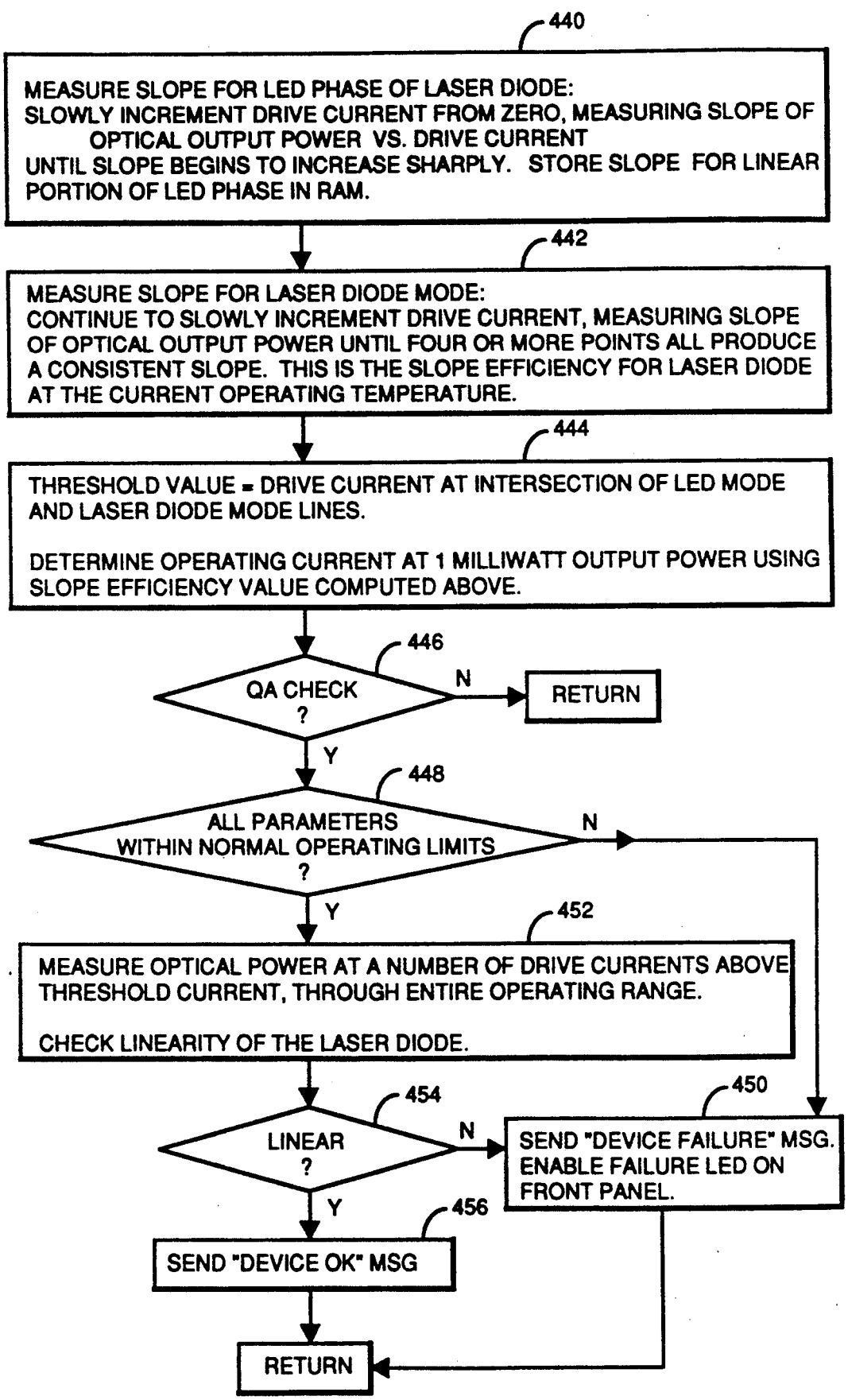

Referring to FIGS. 8 and 9, whenever the laser diode controller is powered on, it performs a sequence of self initialization steps, under the control of a power on sequence program 390, before turning on the laser diode. During this initialization sequence, a front panel LED flashes, indicating that the laser diode is being initialized.

The controller checks the stability of the power supply 174 by measuring the voltage provided by the power supply, and waits for that value to settle down before proceeding any further (step 400).

If the laser diode is a high performance laser diode which includes a thermoelectric cooler (step 402), the controller turns on the thermoelectric cooler and waits until the laser diode's temperature sensor indicates that the temperature has stabilized at the specified target temperature for the laser diode 404. The controller continues thereafter to run a background temperature control routine 404 which modulates the TEC's drive current so as to try to maintain the laser diode at the specified temperature. In the preferred embodiment, the temperature control routine prevents TEC burnout by preventing the drive current for the TEC from exceeding a predefined level at which it is known the TEC can operate indefinitely without burning out. If the TEC is unable to keep the laser diode close to its specified target temperature, the temperature control routine forces the controller to reduce the optical output power by a predefined percentage, such as twenty-five percent, so as to reduce the amount of heat generated and so as to prevent premature aging of the laser diode. Alternately, the temperature control routine can simply shut down the laser diode subsystem until better operating conditions are restored.

Next, the microcontroller accesses nonvolatile (EEPROM) memory 166 to see whether there is a calibration value stored in that memory (box 406). If no calibration value is stored, that indicates that this is the first time that the laser diode has been turned on, and therefore proceeds with the next step, which is to determine whether a light meter is coupled to the output of the laser diode (box 408) using a physical connection scenario such as the one shown in FIG. 4. The presence of a light meter is determined by sending a message via the communications port 200. If a light meter is in place, the computer 202 sends back a corresponding message.

If a light meter is not connected to the laser diode, the power on sequence control program will use a default calibration value for the back facet photodiode, and the program will skip over the calibration step 410. The default calibration value used is an "average" value for the type of laser diode and photodiode being used (step 412). While this is tolerable, in some embodiments of the present invention, if the laser diode has not yet been calibrated, the power up sequence program for the controller will prevent operation of the laser diode until a light meter is connected so as to enable calibration.

Calibration (step 410) is performed by slowly increasing the drive current of the laser diode until the light meter signals that the optical output power has reached a predefined level such as one milliwatt. Typically, the drive current will be started at a low value, such as 10 milliamps, and then increased at a very slow rate, such as 1 milliamp per second, with a limit on the maximum drive current, such as 50 milliamps (plus a temperature compensation value, if necessary). When the light meter signal is received, the drive current is held steady while the back facet photodiode current is measured and then stored in location 330 of the nonvolatile memory 166 as the calibration value, thereby establishing the ratio of back facet photodiode current to front facet optical output power. If the back facet photodiode is nonlinear, measurements are made at the additional calibration required for computing the coefficients of a nonlinear equation which defines the relationship between back facet photodiode current and front facet optical output power.

Next, the routine for measuring the laser diode's device characteristics is called (step 414). That routine is shown in FIG. 9, and will be discussed below. That routine measures the optical output of the laser diode at a range of drive currents, and then computes the slope efficiency of the laser diode, the threshold current for the laser diode, and the operating current for a predefined level of optical output power, such as one milliwatt.

At step 416 the power up sequence routine then stores the threshold current for the laser diode, and the operating current for the predefined level of optical output power, as well as the current operating temperature in the appropriate location in the EEPROM 166. If this is the first time that the laser diode has been turned on (as can be determined by inspecting location 332 of the EEPROM to see whether it is empty), these values are stored location 332. Otherwise, they are stored in location 346 of the EEPROM.

Next, at step 418 the device measurements from step 414 are compared with a set of predefined device failure criteria. For example, in one preferred embodiment the device failure criterion is that the drive current required to generate the predefined optical output level, after any required temperature compensation has been taken into account, be greater than the original drive current required (when the device was new) by ten percent or more. If that criterion is met, failure of the device is imminent, and therefore the failure LED 204 on the front panel of the controller is enabled, and a failure prediction message is transmitted via the controller's output port 200.

Assuming that the laser diode has not failed, the drive current of the laser diode is increased by the controller to the level required for normal operation, which is typically specified as a particular d.c. optical output power level (step 420). The drive current required is computed from the threshold current and the slope efficiency of the laser diode, both of which were previously determined during step 414. Furthermore, the output power is checked, by measuring the current generated by the back facet photodiode and scaling that measurement by the calibration value for the laser diode, and adjusted if necessary by adjusting the drive current. Then the "normal operation" LED on the front panel of the controller is enabled, and a "ready to transmit" message is sent to the host computer 202 via the communications port. The "ready to transmit" message indicates to the host computer that the optical link coupled to the laser diode is ready for normal operation.

After the laser diode begins normal operation, steps 414 through 418 are repeated periodically (step 422), such as once every ten hours of operation, so that the controller can monitor the operability of the laser diode. The data from these periodic maintenance checks are stored in the appropriate locations in the EEPROM 216, which also allows this maintenance data to be retrieved and analyzed by the host computer 202.

Referring to FIG. 9, the routine for measuring the device characteristics of the laser diode (called by step 414 of the program shown in FIG. 8) starts at step 440, which measures the slope of the laser diode's optical output power in the LED mode. To do this, the drive current of the laser diode is slowly increased from an initial low value, such as 5 milliamps, measuring the optical output power at each 1 milliamp interval, and computing the slope of the optical output power. The optical output power is measured using the back facet photodiode, as described above. This sequence continues until the slope of the optical output power begins to increase, indicating that the laser diode is entering lasing mode.

At step 442, the drive current for the laser diode continues to be slowly incremented in small steps, measuring the slope of the optical output power until four or more points are measured which produce a consistent slope, thereby indicating that the laser diode is lasing. This slope is the slope efficiency for the laser diode at the current operating temperature.

Next, at step 444, the threshold value for the laser diode is determined by finding the intersection of the optical output power lines for LED mode and for lasing mode, as measured by steps 440 and 442. Furthermore, the slope efficiency of the laser diode in lasing mode is used to compute the operating current required for generating a predefined level of optical output power, such as one milliwatt.

Additional quality assurance checks can be performed using the controller, such as for checking a batch of laser diode that were not thoroughly checked by the manufacturer. Typically, these additional quality assurance checks will be performed only the first time that the laser diode is turned on.

If further quality assurance checking is enabled (step 446), the routine will first check that all the parameters previously measured are within predefined normal operating limits (step 448). If not, a "device failure" message is sent to the host computer 202, and the device failure LED on the controller's front pane is enabled (step 450).

If the first quality assurance check is passed (step 446), the routine next checks the linearity of the laser diode. This is done by stepping the laser diode through a number of drive current values, covering the entire normal operating range of the laser diode, such as the drive currents required for generating optical output power levels ranging from 0.5 milliwatt to 4.0 milliwatts, using the previously measured slope efficiency value (step 452). The optical output power at each drive current is measured, using the back facet photodiode, and then these measurements are checked to see if they all fall along a line (step 454). Linearity is checked by performing a least squares fit on the measurement data to determine the position of the line which best fits the measurement data, and then finding the distance of each measurement point from that line. If the distances of the points from the line exceed a predefined value, particularly at the highest normal output powers, this is an indication that the diode may be damaged (e.g., dark line defects), and a device failure message is sent to the host computer 202 (step 450). If the laser diode measurements show that the laser diode passes the linearity test of step 454, a "device okay" message is sent to the host computer.

Note that when the characteristics of the laser diode are being rechecked pursuant to step 422 of FIG. 8, step 440 is omitted because the LED phase of the laser does not change significantly over the life of the laser diode. Furthermore, in the preferred embodiment the d.c. drive current is tested only over a small range so as not to interfere with the transmission of data over the optical link. This range of test points need only vary the d.c. drive current by a small amount, such as ten percent of the previously selected bias point, so as to enable the controller to recompute the slope efficiency of the laser diode and the threshold value of the laser diode by finding the intersection of the lasing mode characteristic with that of the previously measured LED phase characteristic curve (see FIG. 2). In an alternate embodiment, just before performing the periodic self tests, the controller sends a message to the host computer 202 via the RS232 port 200 telling it to stop data transmissions until the self test is completed.

FULL DUPLEX LINK INITIALIZATION.

The power up sequence is somewhat different for full duplex optical links (see full duplex link in FIG. 5). In particular, step 420 in FIG. 8, at which point the drive current is increased to initiate normal operation of the laser diode, is replaced for full duplex links by the sequence of steps shown in FIG. 10.

Laser diodes emit very bright and coherent radiant energy that is normally invisible to the human eye. This energy could cause harm to human eyes if the output of the laser diode is misdirected. In the context of a full duplex link, it is possible to use the digital controller of the present invention to insure that the link is intact before the controller enables normal operation of the laser diode.

Figure 10:
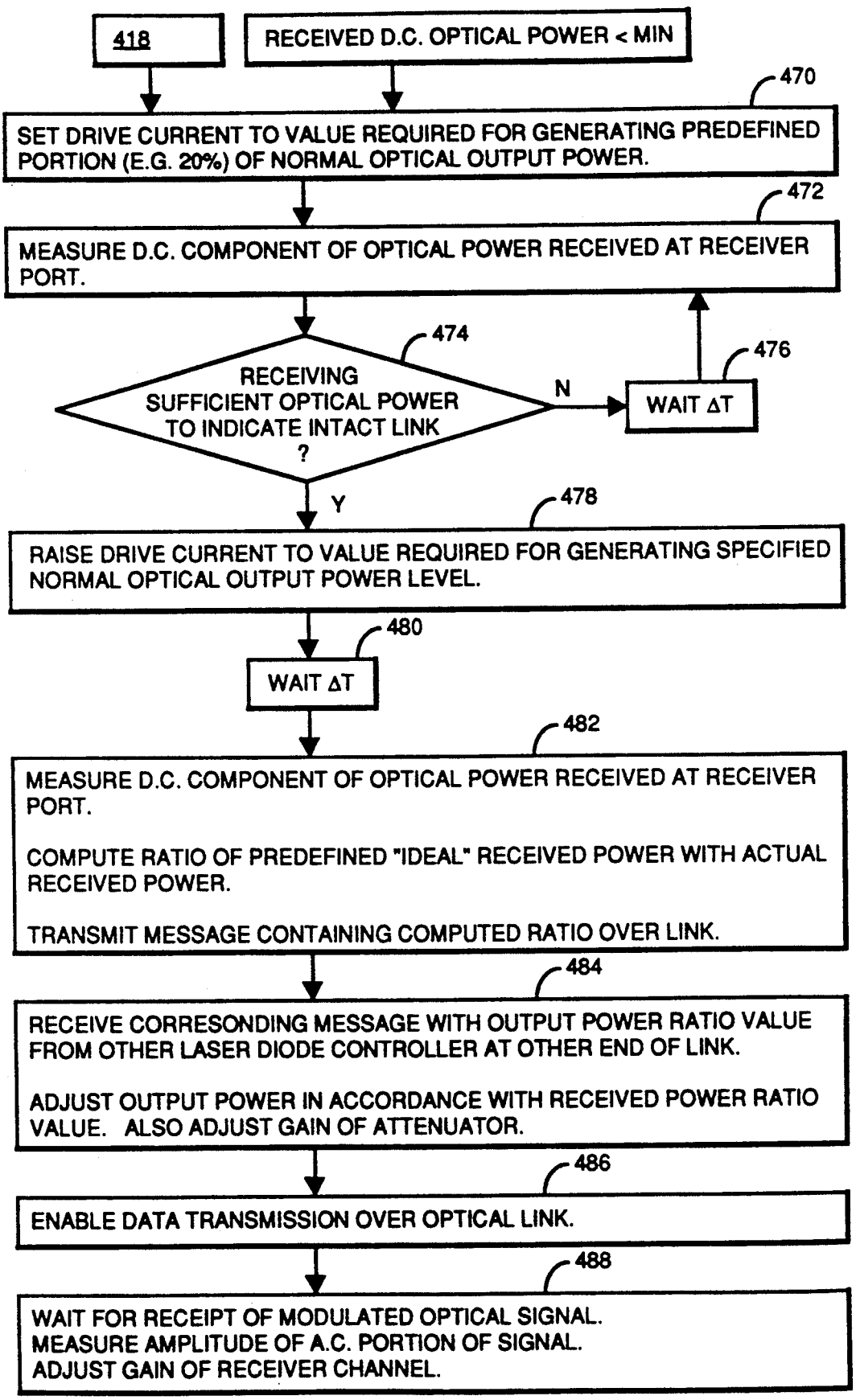
FIG. 10 is a flow chart of a method of initializing each laser diode in a full duplex optical link.

In particular, after the initial device measurements are performed, and after step 418 in FIG. 8 has been performed, the power up sequence control program for full duplex links switches to step 470 in FIG. 10. At step 470, the drive current for the laser diode is initially set so as to output much less power than during normal operation, such as ten percent of normal power (e.g., 0.20 milliwatts instead of 2.0 milliwatts). This initial output level is selected so as to be sufficient for the two controllers 302 and 312 shown in FIG. 5 to test the integrity of the full duplex link. Note that such links can be designed to have a predictable and often very low amount optical loss (i.e., a low loss of power caused by the transmission of the generated light through optical fiber 308 or 318) eVen for links which are up to a couple of kilometers in length. Furthermore, note that both controllers 302 and 312 in FIG. 5 will be executing the same power up sequencing routine, and therefore the steps shown in FIG. 10 are executed more or less in parallel in the two controllers.

After turning on the laser diode at a low optical output level, the controller measures the d.c. component of the optical power received at its receiver port 306 (step 472). If the link is intact, and the other laser diode has been powered on, the received optical power will be sufficient to indicate that the link is intact (step 474). If the required level of optical power is not being received, this means that either the link is not intact, or the other laser diode has not been turned on. In either case, the routine waits for a short period of time (step 476), and then repeats steps 472 and 474 until the presence of an intact optical link is established.

Once the presence of an intact link has been established, the drive current for the laser diode is increased to the level required for normal operation (step 478). Then, after a short wait (step 480), the controller once again measures the d.c. component of the optical power received at its receiver port 306 (step 482). Since link operation assumes both devices are working, if each receiver does not sense full power operation in a reasonable period of time (typically less than one hundred milliseconds) then the system resets to step 470 and the start up procedure for the link begins again.

In an alternate embodiment, the full duplex link is brought up by first transmitting at five percent of full power on the outgoing link until light above a threshold level is received on the incoming link, at which point the transmitted optical power is increased to a slightly higher level which is still much less than full power, such as ten percent of full power. When, and if, the intensity of light received on the incoming link increases by a similar amount, then the integrity of the outgoing link has been established and the outgoing link is brought to full power and data transmission is enabled. This alternate methodology avoids transmission at full power until such time that the integrity of both branches of the full duplex link has been fully established.

The controller also computes the ratio of a predefined "ideal" received optical power level to the actual received d.c. optical power level. Note that the useful life of a laser diode can be approximately doubled by halving the optical output power used during normal operation. Therefore the "ideal" received optical power will typically be a relatively low power level, such as 0.75 milliwatts. In any case, the computed ratio is then transmitted by the controller over the optical link. The purpose of the transmitted message is to notify the controller on the other end of the link as to how it should modify the optical output power of its laser diode. In most situations, this will enable the controller to use a significantly lower optical output power than would be required in a system without this capability, thereby significantly extending the lifetime of the laser diodes being used. The reason that the output power will be lower than would otherwise be required is that systems without this power adjustment feature need to be able to handle "worst case" situations. Therefore such systems must generate sufficient optical output power to make an link operational in a wide variety of environments, even though most links will not actually need to use such a high optical output level in order to function properly.

In one preferred embodiment, this transmission is performed by modulating the d.c. level of the laser diode (i.e., modulating the signal on line 178 shown in FIG. 3), using a relatively slow data transmission rate, such as ten or twenty bits per second. Since the entire message needed is only about sixteen bits long (e.g., five synchronization bits, plus an eight bit ratio value, plus a three bit error correction code), this process will only take one or two seconds, even at such slow data rates. The reason that data transmission is so slow is due to the need to protect the laser diode from sudden current fluctuations through the use of an RC circuit 176 having a relatively long time constant, as explained above.

In other embodiments, the transmission is performed by sending data through multiplexer 192. This allows data transmission at much higher rates, such as 100 kilobits per second. However, in these embodiments the controller must have a data receiver circuit (not shown in the Figures) in the receiver channel for receiving such messages, which significantly increases the cost of the controller.

In the preferred embodiment, the transmitted ratio value is 100 if no adjustment in power is required. Values above 100 indicate that the output power should be increased by X percent, where X is the transmitted value divided by 100. Values below 100 indicate that the output power should be decreased, where the ideal output power is the current output power multiplied by X and then divided by 100.

In any case, at about the same time that the controller is transmitting its power ratio message over the link, the other controller at the other end of the link is doing the same thing. Therefore, the controller will receive a corresponding message with an output power ratio value from the other laser diode controller at the other end of the link (step 484). Then the controller adjusts its output power in accordance with the received power ratio value X, as follows:

New Power Level=(Old Power Level)×X/100.

In addition, the gain of the controller's transmission data attenuator 184 will be adjusted in a similar fashion so that the depth of modulation caused by data transmission remains at approximately the same as before.

At this point, both controllers at both ends of the link will enable data transmission over the link (step 486).

Finally, the controller monitors the peak-to-peak amplitude of the a.c. portion of the received optical signal, waiting for the receipt of modulated optical signals. Once data transmission begins, the controller measures the amplitude of the a.c. portion of the received optical signal, and adjusts the gain of the amplifier 232 in the receiver channel, if necessary, so as to ensure reliable data transmission (step 488).

With regard to the security of data transmitted over optical links, it has been established that it is a relatively easy matter to tap into an optical link by bending an optical fiber, causing a portion of the optical energy in the fiber to be transmitted and "lost" through the fiber's cladding. The light exiting the fiber at the location of the bend can be read using standard optical and electro-optical components, thereby compromising the security of the transmitted data. Once the integrity of an optical link has been established, the controller of the present invention can be programmed to detect decreases in the received optical power. For example the controller can be programmed to detect any decrease of more than five percent, as compared to the previously established level of received d.c. power, and to transmit a message to a host computer whenever such a fluctuation is detected. Such a message will notify the system monitor that the security of the optical link may have been compromised.

USER INTERFACE.

Referring to FIGS. 3 and 11, the controller's software includes a user interface routine 392 which allows the user to access status information in the controller via a host computer 202, to view the data stored in the controller's nonvolatile memory 166, and to set and/or reset various parameters such as the optical output power (i.e., the number of milliwatts of optical output power to be produced by the laser), the target temperature for the laser diode if it is coupled to a thermoelectric cooler, and the attenuator setting for controlling the RF power of the signals being transmitted.

FIG. 11 shows the display generated by the user interface routine 392 on the display of the host computer, and also shows the commands used to modify the laser diode's parameters. The displayed "XX.X" values are measurements calculated by converting count values for the A/D and D/A converters. The displayed "ZZZZ" values are raw A/D converter values, and the displayed "YYYY" values are raw D/A converter values. The displayed "SS.S" values are specified set point values in units of milliwatts for the optical output power and RF transmission power, and in units degrees Centigrade for temperature.

The display items in the boxed area are optionally displayed items that are viewed if the keyboard command <CNTRL>D is entered. The four parameters shown in this boxed area can be modified by selecting "Manual Control" from the Main Menu on the bottom half of the display and then adjusting the displayed values up or down using the commands shown in FIG. 11.

The three set point values shown in the display can be modified by selecting "Set Point Control" from the Main Menu, when enables the user to adjust the set points up or down using the commands shown in the Figure.

The Debug command on the Main Menu brings up a new display, not shown, which lists the supply voltages in the device, the data stored in the EEPROM, and also allows the user to view all the initialization data for the laser diode. Thus the Debug command is primarily intended for use by the manufacturer when first testing new laser diodes and when performing post mortems on laser diodes that have either failed initial tests or which have aged or otherwise become nonfunctioning.

ALTERNATE EMBODIMENTS

It is important to note that the back facets of some laser diodes are coated with a reflective material, such as aluminum, making the back facet unavailable for monitoring the optical output power of the device. In such laser diodes, the front facet is tapped so as to divert a portion of the laser diode's power to a monitoring photodiode. Typically a beam splitter is coupled to or placed near the front facet with a photodiode positioned to receive the diverted portion of the laser diode's optical output. This laser diode/photodiode configuration is functionally equivalent to the apparatus in the preferred embodiment, and thus the more general term for the "back facet photodiode" is "a photodiode for monitoring the laser diode's optical output power".

Referring to FIG. 12, another link configuration which is envisioned by the inventor is using a single digital controller to control the operating point and other operating parameters of multiple laser diodes. For example, four laser diodes may be used in the link between a computer and a color monitor, with distinct optical channels being used for red, green, blue and synchronization signals. A single controller can be used for multiple laser diodes because it takes very little time to execute the software required for setting up and monitoring each laser diode, and because the quantity of data required to be stored for each laser diode in nonvolatile memory is typically much, much less than the amount of such memory which is available in either a single EEPROM device or even in an EEPROM embedded in a microcontroller.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A controller for a laser diode, comprising:
   an optical power sensor which receives a portion of the light emitted from a laser diode and generates an optical power measurement signal corresponding to the optical power of the light received by said power sensor;
   a drive current circuit, coupled to said laser diode, which applies a specified level of drive current through said laser diode; and
   a digital data processor, coupled to said optical power sensor and to said drive current circuit, which sets said specified level of drive current applied to said laser diode and receives said optical power measurement signal from said optical power sensor; said digital data processor being programmed to step said drive current through a sequence of values, to compute operating characteristics of said laser diode based on received optical power measurement signals for each drive current value, and to select a drive current level for said laser diode based on said received optical power measurement signals.

2. The laser diode controller of claim 1, further including a nonvolatile memory coupled to said digital data processor, said digital data processor being further programmed to detect aging of said laser diode by (A) storing data denoting said computed operating characteristics of said laser diode in said nonvolatile memory, and (B) periodically checking the operability of said laser diode by stepping said drive current through a sequence of values, computing a set of operating characteristics of said laser diode based on received optical power signals for each drive current value, and generating an error signal when said computed set of operating characteristics fail to meet predefined criteria with respect to said operating characteristics stored in said nonvolatile memory.

3. The laser diode controller of claim 1, said digital data processor being further programmed to perform quality assurance tests on said laser diode, where said quality assurance tests compare said computed operating characteristics of said laser diode with predefined criteria and generate an error signal when said computed operating characteristics fail to meet said predefined criteria.

4. The laser diode controller of claim 1, said digital data processor being programmed to test said laser diode for linearity based on said received optical power measurement signals, wherein linearity comprises a consistent rate of increase in optical power with increases in drive current, and to generate an error signal when said laser diode fails to meet predefined linearity criteria.

5. The laser diode controller of claim 1, further including a receiver channel, for receiving light generated by a second laser diode, said two laser diodes forming a full duplex optical link;

monitoring means, coupling said receiver channel to said digital data processor, for generating a received power signal corresponding to the d.c. optical power of said received light from said second laser diode;

said digital data processor including means for receiving said received power signal; said digital data processor being programmed (A) to compare said received power signal with predefined criteria and to thereby determine whether a full duplex optical link has been established between said two laser diodes; (B) to set said drive current level for said laser diode at a first level prior to determining that a full duplex link has been established; and (C) to set said drive current level for said laser diode at a second level after determining that a full duplex link has been established;

wherein said second drive current level causes said laser diode to generate at least twice as much optical output power as said first drive current level.

6. The laser diode controller of claim 5, said digital data processor being programmed to monitor said received power signal so as to detect a breach of said full duplex link and to reset said drive current level back to said first level after detecting said breach.

7. The laser diode controller of claim 5, said digital data processor being programmed to detect decreases of at least a preselected magnitude in said received power signal, and to generate a warning signal whenever such a decrease is detected; whereby said digital data processor can detect an attempt to eavesdrop on data transmitted via said full duplex optical link.

8. The laser diode controller of claim 1, said drive current circuit comprising:

a bipolar transistor having an emitter coupled to a power source, a base coupled to said digital data processor, and a collector directly connected to said laser diode; and a capacitor, connected to said collector, which a.c. couples said collector to an input signal line, said input signal line carrying high frequency signals to be optically transmitted by said laser diode.

9. The laser diode controller of claim 1, further including a nonvolatile memory coupled to said digital data processor, said digital data processor being further programmed to store data in said nonvolatile memory denoting a calibration coefficient for said optical power sensor, initialization values, and said computed operating characteristics of said laser diode, and to use said stored data to set said drive current level for said laser diode each time that said controller is turned on;

whereby said laser diode can be restarted each time that said controller is turned on without having to recalibrate and reinitialize said controller.

10. Multichannel laser diode apparatus, comprising:

a plurality of laser diodes;

a separate optical power sensor positioned near each of said laser diodes so as to receive a portion of the light emitted from said laser diode, said optical power sensor generating an optical power measurement signal corresponding to the optical power of the light received by said power sensor;

a separate drive current circuit coupled to each said laser diode, each said drive current applying a separately specified level of drive current through a corresponding one of said laser diodes; and a single digital data processor, coupled to all of said optical power sensors and to all of said drive current circuits, which sets said specified drive current levels applied to said laser diodes and which receives said optical power measurement signals from said optical power sensors; said digital data processor being programmed to step said drive current for each laser diode through a sequence of values, to compute operating characteristics of each said laser diode based on received optical power measurement signals for each drive current value, and to select a drive current level for each said laser diode based on said received optical power measurement signals.

11. The multichannel laser diode apparatus of claim 10, each said drive current circuit comprising:

a bipolar transistor having an emitter coupled to a power source, a base coupled to said digital data processor, and a collector directly connected to said laser diode; and a capacitor, connected to said collector, which a.c. couples said collector to an input signal line, said input signal line carrying high frequency signals to be optically transmitted by said laser diode.

12. The multichannel laser diode apparatus of claim 10, further including a nonvolatile memory coupled to said digital data processor, said digital data processor being further programmed to detect aging of each said laser diode by (A) storing data denoting said computed operating characteristics of said laser diode in said nonvolatile memory, and (B) periodically checking the operability of said laser diode by stepping said drive current through a sequence of values, computing a set of operating characteristics of said laser diode based on received optical power signals for each drive current value, and generating an error signal when said computed set of operating characteristics fail to meet predefined criteria with respect to said operating characteristics stored in said nonvolatile memory.

13. The multichannel laser diode apparatus of claim 10, further including a nonvolatile memory coupled to said digital data processor, said digital data processor being further programmed (A) to store data in said nonvolatile memory denoting a calibration coefficient for each said optical power sensor, initialization values for said laser diodes, and said computed operating characteristics of said laser diodes, and (B) to use said stored data to set said drive current levels for said laser diodes each time that said controller is turned on;

whereby said laser diodes can be restarted each time that said controller is turned on without having to recalibrate and reinitialize said controller.

14. A controller for a laser diode having a back facet and a front facet, including:

a back facet photodiode which receives light emitted from a laser diode's back facet and generates an optical power measurement signal corresponding to the optical power output by said back facet of said laser diode;

a drive current circuit, coupled to said laser diode, which applies a specified level of drive current through said laser diode; and a digital data processor, coupled to said back facet photodiode and to said drive current circuit, which sets said specified level of drive current applied to said laser diode and receives said optical power measurement signal from said back facet photodiode; said digital data processor being programmed to step said drive current through a sequence of values, to compute operating characteristics of said laser diode based on received optical power measurement signals for each drive current value, and to select a drive current level for said laser diode based on said received optical power measurement signals.

15. A method of controlling a laser diode, the steps of the method comprising:

applying a drive current to a laser diode so as to generate light;

measuring said generated light's optical power;

providing a digital data processor; and under control of said digital data processor, automatically stepping said drive current through a sequence of values, receiving said optical power measurement for each drive current value, computing operating characteristics of said laser diode based on said received optical power measurement for each drive current value, and selecting a drive current level for said laser diode based on said received optical power measurement signals.

16. The method of controlling a laser diode set forth in claim 15, further including the steps of storing data denoting said computed operating characteristics of said laser diode in a nonvolatile memory, and periodically checking the operability of said laser diode by stepping said drive current through a sequence of values, receiving a measurement of optical power for each drive current value, computing a set of operating characteristics of said laser diode based on said received optical power measurement for each drive current value, and generating an error signal when said computed set of operating characteristics fail to meet predefined criteria with respect to said operating characteristics stored in said nonvolatile memory.

17. The method of controlling a laser diode set forth in claim 15, further including the steps of comparing said computed operating characteristics of said laser diode with predefined criteria; and generating an error signal when said computed operating characteristics fail to meet said predefined criteria.

18. The method of controlling a laser diode set forth in claim 15, further including the steps of testing said laser diode for linearity based on said received optical power measurements, wherein linearity comprises a consistent rate of increase in optical power with increases in drive current, and generating an error signal when said laser diode fails to meet predefined linearity criteria.

19. The method of controlling a laser diode set forth in claim 15, further including the steps of providing a receiver channel which receives light generated by a second laser diode, said two laser diodes forming a full duplex optical link;

measuring the d.c. optical power of said received light from said second laser diode;

under the control of said digital data processor, receiving said d.c. optical power measurement for said second laser diode, comparing said d.c. optical power measurement with predefined criteria and to thereby determining whether a full duplex optical link has been established between said two laser diodes, setting said drive current level for said laser diode at a first level prior to determining that a full duplex link has been established, setting said drive current level for said laser diode at a second level after determining that a full duplex link has been established;

wherein said second drive current level is higher than said first drive current level.

20. The method of controlling a laser diode set forth in claim 19, further including the steps of monitoring said d.c. optical power measurement so as to detect a breach of said full duplex link, and resetting said drive current level back to said first level after detecting said breach.

21. The method of controlling a laser diode set forth in claim 19, further including the steps of detecting decreases of at least a preselected magnitude in said d.c. optical power measurement, and generating a warning signal whenever such a decrease is detected; whereby attempts to eavesdrop on data transmitted via said full duplex optical link are detected.

22. The method of controlling a laser diode set forth in claim 15, said step of applying a drive current including the steps of providing a bipolar transistor having an emitter coupled to a power source, a base coupled to said digital data processor, and a collector directly connected to said laser diode; and providing a capacitor, connected to said collector, which a.c. couples said collector to an input signal line, said input signal line carrying high frequency signals to be optically transmitted by said laser diode.

23. The method of controlling a laser diode set forth in claim 15, further including the steps of
    storing data denoting said computed operating characteristics of said laser diode in a nonvolatile memory, a calibration coefficient for measuring said generated light's optical power, and initialization values; and
    setting said drive current level for said laser diode each time that said controller is turned on using said data stored in said nonvolatile memory.

24. A method of controlling a plurality of laser diodes, the steps of the method comprising:
    applying a separate drive current to each of a plurality of laser diodes, thereby causing each laser diode to generate light;
    measuring said generated light's optical power for each laser diode;
    providing a single digital data processor; and
    under control of said single digital data processor, automatically stepping said drive current for each laser diode through a sequence of values, measuring optical power for the light generated by each laser diode at each drive current value, computing operating characteristics of each said laser diode based on said measured optical power for each drive current value, and selecting a drive current level for each said laser diode based on said optical power measurements.

25. The method of controlling a plurality of laser diodes set forth in claim 24, further including the steps of:
    providing a nonvolatile memory coupled to said digital data processor,
    under the control of said digital data processor, detect aging of each said laser diode by (A) storing data denoting said computed operating characteristics of said laser diode in said nonvolatile memory, and (B) periodically checking the operability of said laser diode by stepping said drive current through a sequence of values, computing a set of operating characteristics of said laser diode based on measurements of optical power for each drive current value, and generating an error signal when said computed set of operating characteristics fail to meet predefined criteria with respect to said operating characteristics stored in said nonvolatile memory.

* * * * *